United States Patent
Venigalla et al.

(10) Patent No.: US 11,882,774 B2
(45) Date of Patent: Jan. 23, 2024

(54) LOW RESISTANCE CROSSPOINT ARCHITECTURE

(71) Applicant: Micron Technology, Inc., Boise, ID (US)

(72) Inventors: Rajasekhar Venigalla, Boise, ID (US); Patrick M. Flynn, Boise, ID (US); Josiah Jebaraj Johnley Muthuraj, Meridian, ID (US); Efe Sinan Ege, Boise, ID (US); Kevin Lee Baker, Boise, ID (US); Tao Nguyen, Boise, ID (US); Davis Weymann, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/468,167

(22) Filed: Sep. 7, 2021

(65) Prior Publication Data

US 2022/0069216 A1    Mar. 3, 2022

Related U.S. Application Data

(62) Division of application No. 16/684,520, filed on Nov. 14, 2019, now Pat. No. 11,121,317.

(51) Int. Cl.
*H10N 70/00* (2023.01)
*H01L 21/768* (2006.01)
(Continued)

(52) U.S. Cl.
CPC ..... *H10N 70/8616* (2023.02); *G11C 13/0004* (2013.01); *H01L 21/76802* (2013.01);
(Continued)

(58) Field of Classification Search
CPC ............. H10N 70/8686; H10N 70/021; H10N 70/231; H10N 70/826; H10N 70/841;
(Continued)

(56) References Cited

U.S. PATENT DOCUMENTS 9,153,777 B2 * 10/2015 Boniardi .............. H10N 70/882
9,735,202 B1    8/2017 Tanaka et al.
(Continued)

FOREIGN PATENT DOCUMENTS

JP    2005-294848 A    10/2005
JP    2007-027760 A    2/2007
(Continued)

OTHER PUBLICATIONS

Chinese Patent Office, "Office Action", issued in connection with Chinese Patent Application No. 202080078630.4 dated Jan. 6, 2023 (12 pages) (6 pages of English Translation and 6 pages of Original Document).

(Continued)

*Primary Examiner* — Shahed Ahmed
*Assistant Examiner* — Vicki B. Booker
(74) *Attorney, Agent, or Firm* — Holland & Hart LLP

(57) ABSTRACT

Methods, systems, and devices for a low resistance crosspoint architecture are described. A manufacturing system may deposit a thermal barrier material, followed by a first layer of a first conductive material, on a layered assembly including a patterned layer of electrode materials and a patterned layer of a memory material. The manufacturing system may etch a first area of the layered assembly to form a gap in the first layer of the first conductive material, the thermal barrier material, the patterned layer of the memory material, and the patterned layer of electrode materials. The manufacturing system may deposit a second conductive material to form a conductive via in the gap, where the conductive via extends to a height within the layered assembly that is above the thermal barrier material.

6 Claims, 8 Drawing Sheets

(51) Int. Cl.
  *H01L 23/522* (2006.01)
  *G11C 13/00* (2006.01)
  *H01L 23/528* (2006.01)
  *H10B 63/00* (2023.01)
  *H10N 70/20* (2023.01)

(52) U.S. Cl.
  CPC .. *H01L 21/76831* (2013.01); *H01L 21/76834* (2013.01); *H01L 21/76843* (2013.01); *H01L 21/76877* (2013.01); *H01L 23/528* (2013.01); *H01L 23/5226* (2013.01); *H10B 63/84* (2023.02); *H10N 70/021* (2023.02); *H10N 70/231* (2023.02); *H10N 70/826* (2023.02); *H10N 70/841* (2023.02); *G11C 13/004* (2013.01); *G11C 13/0069* (2013.01); *G11C 2013/005* (2013.01); *G11C 2013/0078* (2013.01); *G11C 2213/52* (2013.01); *G11C 2213/71* (2013.01); *H10N 70/8825* (2023.02)

(58) Field of Classification Search
  CPC ............ H10N 70/8825; G11C 13/0004; G11C 13/004; G11C 13/0069; G11C 2013/005; G11C 2013/0078; G11C 2213/52; G11C 2213/71; H01L 21/76802; H01L 21/76831; H01L 21/76834; H01L 21/76843; H01L 21/76877; H01L 23/5226; H01L 23/528; H10B 63/84
  See application file for complete search history.

(56) References Cited

U.S. PATENT DOCUMENTS

| | | |
|---|---|---|
| 2005/0221511 A1 | 10/2005 | Wang et al. |
| 2007/0051982 A1 | 3/2007 | Bloom et al. |
| 2007/0120106 A1 | 5/2007 | Hayakawa et al. |
| 2007/0246782 A1 | 10/2007 | Philipp et al. |
| 2009/0137112 A1 | 5/2009 | Tabata et al. |
| 2011/0068318 A1 | 3/2011 | Ishibashi et al. |
| 2013/0277640 A1 | 10/2013 | Nishimura et al. |
| 2013/0313502 A1 | 11/2013 | Park |
| 2014/0117302 A1* | 5/2014 | Goswami ............. H10N 70/826 257/4 |
| 2017/0236871 A1 | 8/2017 | Tanaka et al. |
| 2017/0271580 A1 | 9/2017 | Park et al. |
| 2018/0204880 A1 | 7/2018 | Fantini |
| 2019/0043807 A1* | 2/2019 | Redaelli .................... G11C 7/18 |
| 2019/0043924 A1* | 2/2019 | Conti ..................... H10B 63/24 |
| 2019/0123276 A1 | 4/2019 | Ratnam et al. |
| 2020/0051624 A1* | 2/2020 | Economy ............. H10N 70/801 |

FOREIGN PATENT DOCUMENTS

| | | |
|---|---|---|
| JP | 2007-149900 A | 6/2007 |
| JP | 2007-288201 A | 11/2007 |
| JP | 2009-130139 A | 6/2009 |
| JP | 2011-066365 A | 3/2011 |
| JP | 2013-179203 A | 9/2013 |
| JP | 2013-225668 A | 10/2013 |
| KR | 20130092925 A | 8/2013 |
| KR | 20170108599 A | 9/2017 |
| TW | 201926671 A | 7/2019 |
| TW | 201937704 A | 9/2019 |
| TW | 201943057 A | 11/2019 |
| WO | 2018/004587 A1 | 1/2018 |
| WO | 2019/177632 A1 | 9/2019 |

OTHER PUBLICATIONS

"ISA/KR, International Search REport and Written Opinion of the Internatioanl Searching Authority, Int'l Appl. No. PCT/US2020/057556, dated Feb. 19, 2021, Korean Intellectual Property Office, Seo-gu, Daejeon, Republic of Korea, 9pgs".

Taiwan Intellectual Property Office, "Office Action," issued in connection with ROC (Taiwan) Patent Application No. 109137562, dated Jul. 28, 2021 (3 pages).

Japan Patent Office, "Office Action," issued in connection with Japan Patent Application No. 2022-527890 dated Oct. 3, 2023 (6 pages).

\* cited by examiner

LOW RESISTANCE CROSSPOINT ARCHITECTURE

CROSS REFERENCE

The present Application for Patent is a divisional of U.S. patent application Ser. No. 16/684,520 by Venigalla et al., entitled "LOW RESISTANCE CROSSPOINT ARCHITECTURE" filed Nov. 14, 2019, assigned to the assignee hereof, and is expressly incorporated by reference in its entirety herein.

BACKGROUND

The following relates generally to one or more memory systems and more specifically to low resistance crosspoint architecture.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
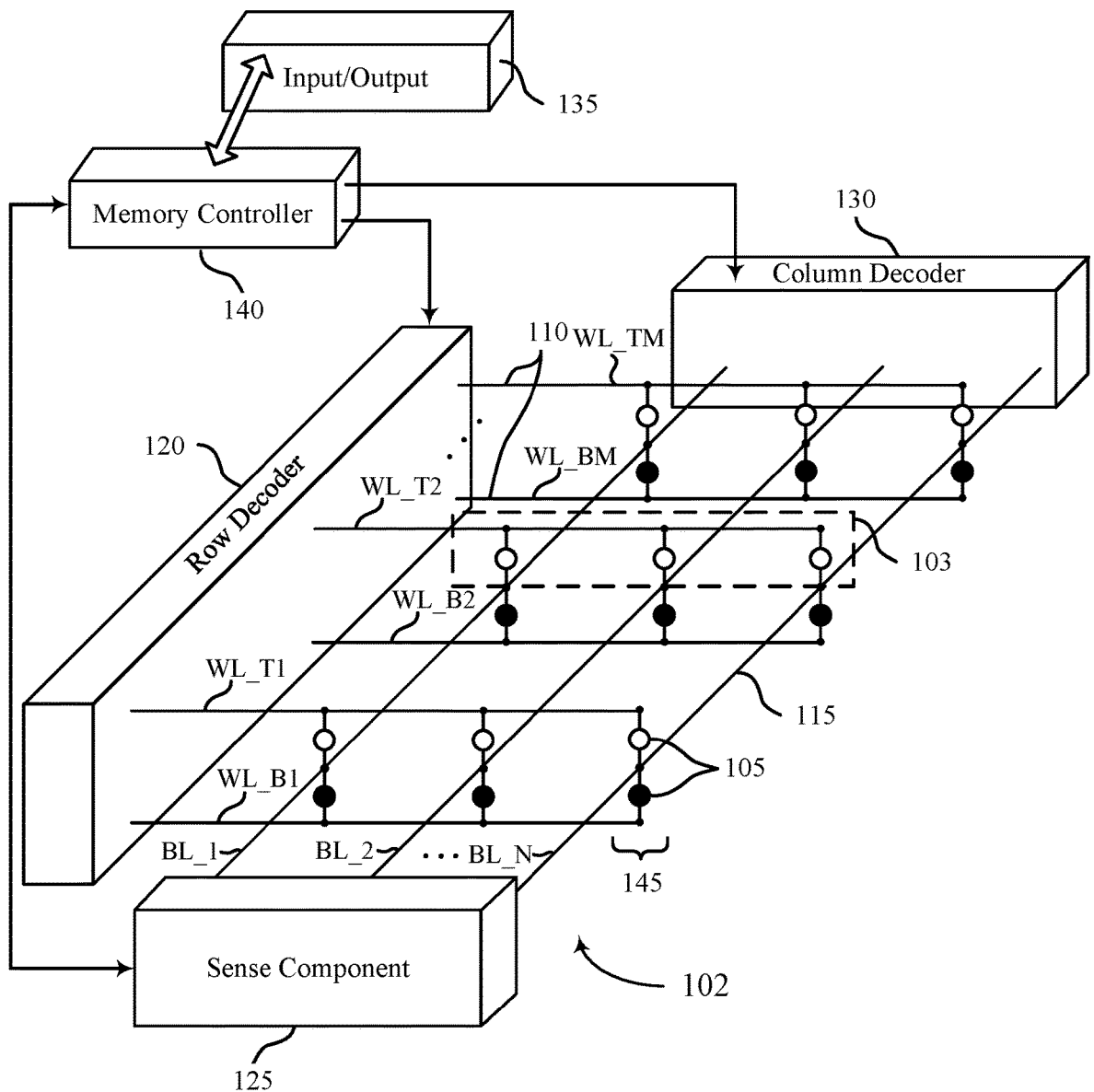
FIG. 1 illustrates an example of a memory device that supports low resistance crosspoint architecture in accordance with examples as disclosed herein.

It may be desirable to form smaller memory cells, for example, to increase the storage density of a memory array, decrease power consumption per memory cell, decrease manufacturing costs, etc. In some cases, memory cells may be formed in a three-dimensional (3D) structure (e.g., having one or more layers of memory where each layer extends in two dimensions). The 3D structure may be formed above a substrate (e.g., silicon wafer), and may be formed of layers of conductive material (e.g., for access lines such as word and bit lines), a memory material (e.g., chalcogenide), and other materials (e.g., electrode materials, dielectric materials). As memory cell structures become smaller, secondary effects from manufacturing processes (e.g., etch damage, material contamination, etc.) may have a greater impact on the structure and function of the final memory cell. Furthermore, an array of memory cells may be formed above a substrate and electrodes (e.g., vias) formed between the memory layers or other layers (e.g., substrate layers) made through the array of memory cells by performing an array termination etch and deposition of additional materials (e.g., dielectric materials, via materials).

In some cases, a thermal barrier material may be present in between a memory stack containing a memory cell and an access line for that memory cell. The thermal barrier material may limit an amount of heat that may be transferred from the memory stack to the access line and vice-versa, which may improve thermal properties and current response of the memory cell for programming SET or RESET states. However, thermal barrier materials may have an associated resistance that may affect current delivery if within the electrode path. In some methods of manufacturing, thermal barrier materials may be also be present between a conductive via used to transmit a signal to an access line and the access line. As such, when a signal is transmitted to the access line for a memory cell, the signal may pass through the thermal barrier material twice. However, as noted above, by passing through the thermal barrier twice, less current may be applied to the memory cell than if passing through the thermal barrier once.

To limit the amount of resistance that a thermal barrier material may provide, the thermal barrier material may be deposited prior to performing an array termination etch used to deposit the conductive via. By providing the thermal barrier material before the array termination etch occurs, the array termination etch may remove the thermal barrier material over a portion of the array used to deposit the conductive via. As such, the conductive via may interface with the access line directly (e.g., without the thermal barrier material being present). Additionally, a liner and cap material may be deposited and used to mitigate damage that occurs to the memory array during manufacturing.

Features of the disclosure are initially described in the context of memory devices as described with reference to FIGS. 1-2. Features of the disclosure are described in the context of a manufacturing process as described with reference to FIGS. 3-6. These and other features of the disclosure are further illustrated by and described with reference to flowcharts that relate to low resistance crosspoint architecture as described with references to FIGS. 7 and 8.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100. In the illustrative example of FIG. 1, the memory device 100 includes a 3D memory array 102. The memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The memory array 102 may include two or more two-dimensional (2D) memory arrays 103 formed on top of one another. This may increase a quantity of memory cells that may be placed or created on a single die or substrate as compared with 2D arrays, which in turn may reduce production costs (e.g., cost per bit), or increase the performance of the memory device, or both. The memory array 102 may include two levels of memory cells 105 and may thus be considered a 3D memory array; however, the quantity of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing a word line or a bit line for both as explained below. In some cases, the memory cells may be multi-level memory cells configured to store more than one bit of data using multi-level storage techniques.

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized (may have a voltage potential or current flow) to read or write a memory cell 105 at their intersection. Other memory cells 105 that are in electronic communication with (e.g., connected to) the same access line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different materials.

Operations such as reading and writing may be performed on memory cells 105 by activating or selecting access line 110 and bit line 115. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors (e.g., polysilicon), or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110 for the top array, labeled WL_T1 through WL_TM, multiple word lines 110 for the bottom array, labeled WL-B1 through WL_BM, and multiple digit lines 115, labeled BL_1 through BL_N, where M and N depend on the array size. Thus, by activating a word line 110 and a bit line 115, e.g., WL_T2 and BL_3, the memory cell 105 at their intersection may be accessed. As discussed below in more detail, accessing memory cells 105 may be controlled through a row decoder 120 and a column decoder 130 that may include one or more doped materials (e.g., forming transistors) within or on a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected or a threshold or limit voltage is applied. Likewise, a current may be applied to a memory cell 105 and the magnitude of the voltage to create the current may depend on the electrical resistance or the threshold voltage of the memory cell 105.

In some examples, a memory cell may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the memory cell for achieving the results described herein. This example of a mechanism should not be considered limiting. This disclosure also includes other examples of mechanisms of the memory cell for achieving the results described herein.

Sense component 125 may include various transistors or amplifiers to detect and amplify a difference in the signals, which may be referred to as sensing or latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. The sense component 125 may be associated either with column decoder 130 or row decoder 120.

A memory cell 105 may be set or written by activating the relevant word line 110 and bit line 115 and at least one logic value may be stored in the memory cell 105. Column decoder 130 or row decoder 120 may accept data, for example input/output 135, to be written to the memory cells 105. In the case of a memory cell including a chalcogenide material, a memory cell 105 may be written to store a logic state in the memory cell 105 by applying a first voltage to the memory cell 105 as part of the access operation based on coupling the first conductive line of the decoder (e.g., row decoder 120 or column decoder 130) with the access line (e.g., word line 110 or bit line 115).

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with a word line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. In some cases, the second voltage may cause the doped material to selectively couple the first conductive line of the decoder with the access line associated with the memory cell 105. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may be configured to store a logic state in the memory cell 105 based on applying the first voltage to the memory cell 105. Although discussed as applied by using a first voltage and a second voltage, it should be understood that current may be applied between the first conductive line and second conductive line to perform the access operation, in some cases.

In some examples, each word line 110 and/or each bit line 115 may be coupled with a conductive via that couples the word line 110 and/or bit line 115 with a substrate upon which the memory device 100 rests. Generally, the conductive via may be formed by etching out a portion of the memory array 102 to form a gap and depositing the conductive via material in the gap. However, methods of etching out the portion of the memory array 102 may damage memory cells 105 outside of the intended coverage of the gap, which may be referred to as tile or block damage. Methods of preventing tile or block damage may be described herein. In addition, methods of processing the memory array and conductive vias to reduce a resistance to word lines and/or bit lines are described herein.

Figure 2:
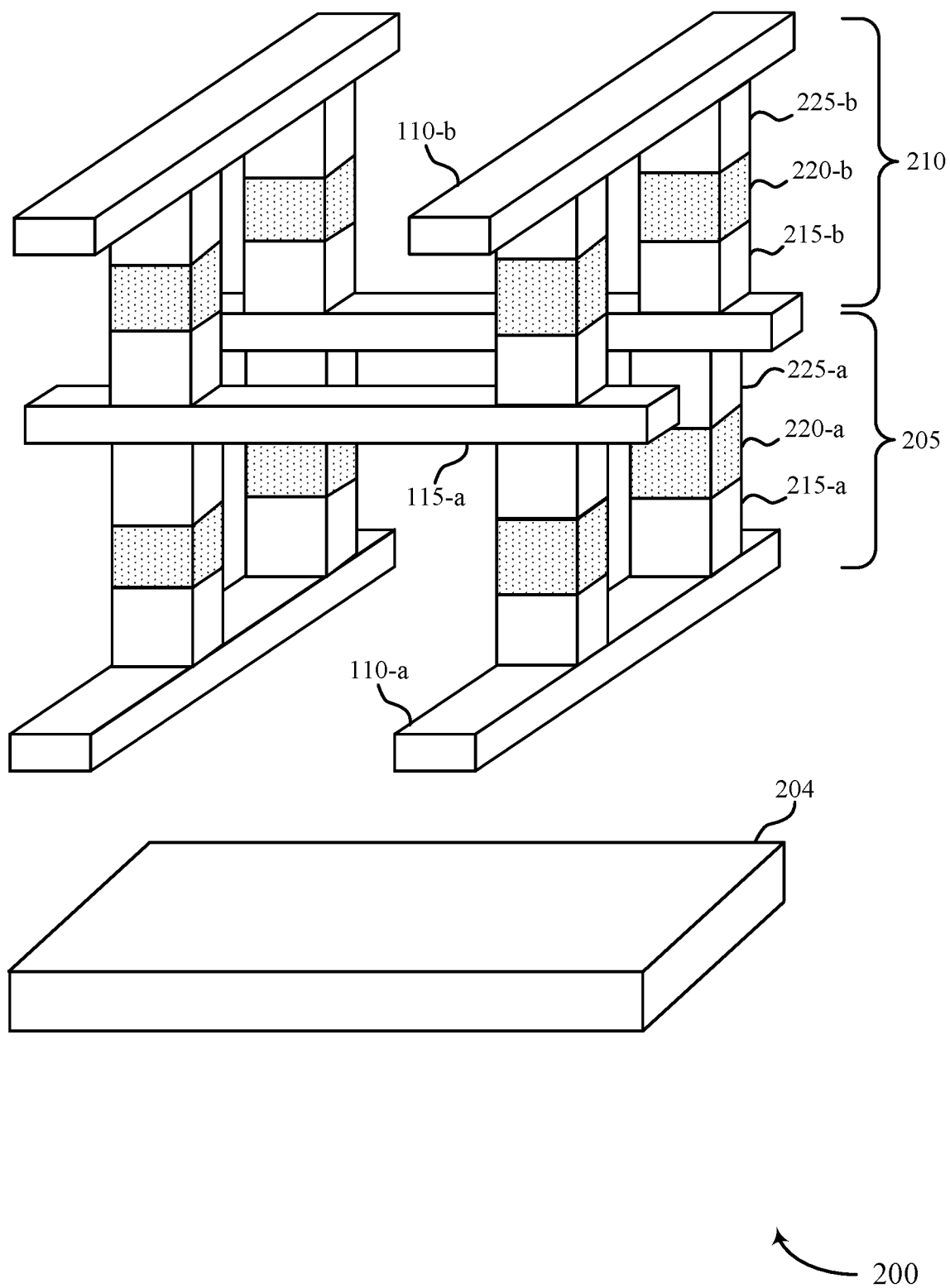
FIG. 2 illustrates an example of a memory array that supports low resistance crosspoint architecture in accordance with examples as disclosed herein.

FIG. 2 illustrates an example of a memory array that supports a memory device 200 in accordance with examples as disclosed herein. Memory device 200 may be an example of portions of memory array 102 described with reference to FIG. 1. Memory device 200 may include a first array or deck 205 of memory cells that is positioned above a substrate 204 and second array or deck 210 of memory cells on top of the first array or deck 205. Memory device 200 may also include word line 110-a and word line 110-b, and bit line 115-a, which may be examples of word line 110 and bit line 115, as described with reference to FIG. 1. The first deck 205 and the second deck 210 each may have one or more memory cell (e.g., memory cell 220-a and memory cell 220-b, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 215-a, memory cell 220-a (e.g., including chalcogenide material), and second electrode 225-a. In addition, memory cells of the second deck 210 may include a first electrode 215-b, memory cell 220-b (e.g., including chalcogenide material), and second electrode 225-b. First electrode 215-a, memory cell 220-a, and second electrode 225-a may form a first memory stack and first electrode 215-b, memory cell 220-b, and second electrode 225-b may form a second memory stack. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 215-b of the second deck 210 and the second electrode 225-a of the first deck 205 may be coupled to bit line 115-*a* such that bit line 115-*a* is shared by vertically adjacent memory cells. In accordance with the teachings herein, a decoder may be coupled with each deck if the memory device 200 includes more than one deck. For example, a decoder may be coupled with first deck 205 and second deck 210. In some cases, the memory cells 220 may be examples of phase-change memory cells or self-selecting memory cells.

The architecture of memory device 200 may be referred to as a cross-point architecture, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture. In some cases, a cross-point architecture may be formed by two consecutive etches or cuts with patterns along orthogonal directions.

While the example of FIG. 2 shows two memory decks, other configurations are possible. In some examples, a single memory deck of memory cells may be constructed above a substrate 204, which may be referred to as a two-dimensional memory. In some examples, three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some examples, a chalcogenide material having primarily Se, As, and Ge may be referred to as SAG-alloy. In some examples, SAG-alloy may include Si and such chalcogenide material may be referred to as SiSAG-alloy. In some examples, the chalcogenide glass may include additional elements such as hydrogen (H), oxygen (O), nitrogen (N), chlorine (CO, or fluorine (F), each in atomic or molecular forms.

In some examples, a memory cell 220 including a chalcogenide material may be programmed to a logic state by applying a first voltage or a first current. By way of example, when a particular memory cell 220 is programed, elements within the cell may separate, causing ion migration. Ions may migrate towards a particular electrode, depending on the polarity of the voltage applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

For example, if a memory cell has a given distribution of ions, the threshold voltage detected during the read operation may be different for a first read voltage with a first polarity than it is with a second read voltage having a second polarity. Depending on the polarity of the memory cell, this concentration of migrating ions may represent a logic "1" or logic "0" state. This description of ion migration represents an example of a mechanism of the memory cell for achieving the results described herein. This example of a mechanism should not be considered limiting. This disclosure is also applicable to other examples of mechanisms of the memory cell for achieving the results described herein.

In some cases, a first voltage may be applied to a first conductive line of a decoder as part of an access operation of the memory cell 220. Upon applying the first voltage, the first conductive line may be coupled with the access line (e.g., word line 110-*a*, word line 110-*b*, or bit line 115-*a*) associated with the memory cell 220. For example, the first conductive line may be coupled with the access line based on a doped material of the decoder which extends between the first conductive line and the access line in a first direction.

In some examples, the first voltage may be applied to the memory cell 220 based on coupling the first conductive line of the decoder with the access line. The decoder may include one or more transistors selectively coupling the first conductive line and the access line of the memory device 200. In some cases, the decoder may be formed in the substrate 204.

In some examples, a thermal barrier may be present in between an electrode and an access line. For instance, a thermal barrier may be present in between electrode 215-*a* and word line 110-*a*; between electrode 225-*a* and bit line 115-*a*; between electrode 215-*b* and bit line 115-*a*; between electrode 225-*b* and word line 110-*b*; or a combination these locations. The thermal barrier material may be configured to reduce diffusion of heat from a memory cell 220 onto a word line 110 or a bit line 115, or vice-versa. The thermal barrier may be a tungsten silicon nitride (WSiN) material.

In some examples, a word line 110 and/or a bit line 115 may be coupled with a conductive via that couples the word line 110 and/or the bit line 115 with the substrate 204. In some cases, a conductive via may be coupled with word lines 110 or bit lines 115 from different decks. For instance, in the present example, a conductive via may be coupled with word line 110-*a* in deck 205 and word line 110-*b* in deck 210. According to techniques described herein, the thermal barrier material may be formed between the electrode material and a word line or a bit line without also being between the conductive via and the word line or bit line.

FIGS. 3A through 6B illustrate manufacturing processes that include performing a series of operations on a layered assembly of materials to form a memory array including a conductive via. These figures illustrate examples of intermediate structures that may be formed by performing operations of the manufacturing processes on a layered assembly of materials. The structures illustrated in FIGS. 3A, 3B, and 3C may represent initial or partial processing steps on the layered assembly. The structures illustrated in FIGS. 4A, 4B, and 4C may represent a first set of processing steps performed after the initial processing steps and the structures illustrated in FIGS. 5A, 5B, 5C, 6A, and 6B may represent a second set of processing steps performed after the initial processing steps. Together, FIGS. 3A, 3B, 3C, 4A, 4B, and 4C may represent a first manufacturing process and FIGS. 3A, 3B, 3C, 5A, 5B, 5C, 6A, and 6B may represent a second manufacturing process. In some cases, the first or second manufacturing processes may include combining various operations, altering the sequence of operations, eliminating one or more steps of these operations, or any combination thereof.

Figure 3A:
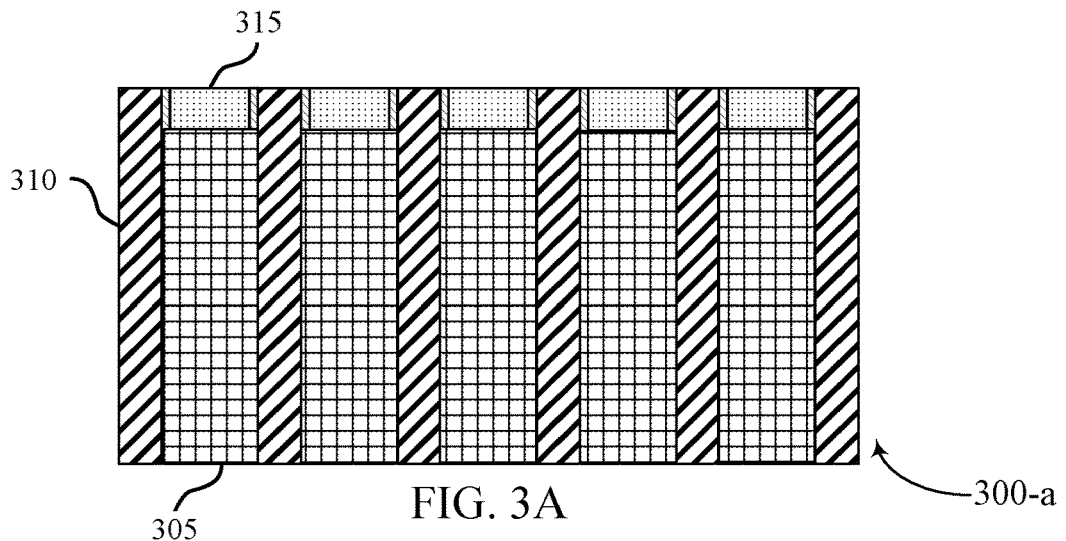
FIG. 3A through 6B illustrate examples of operations performed as part of manufacturing processes that support low resistance crosspoint architecture in accordance with examples as disclosed herein.
Figure 3B:
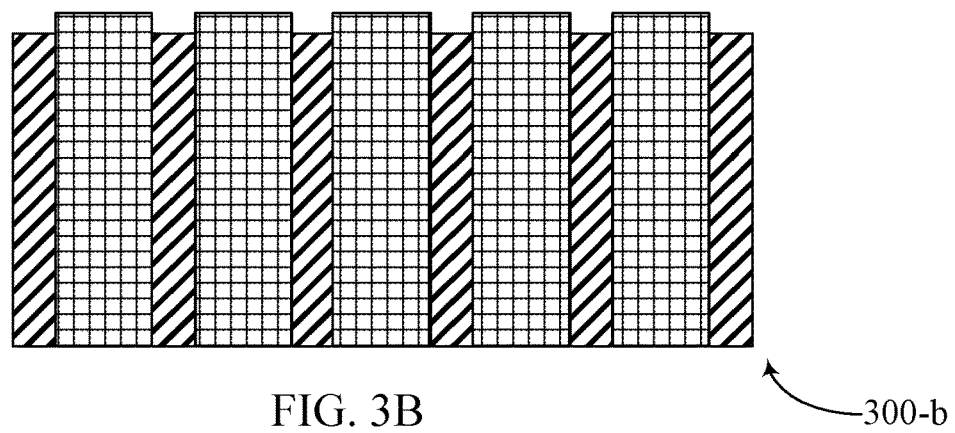
Figure 3C:
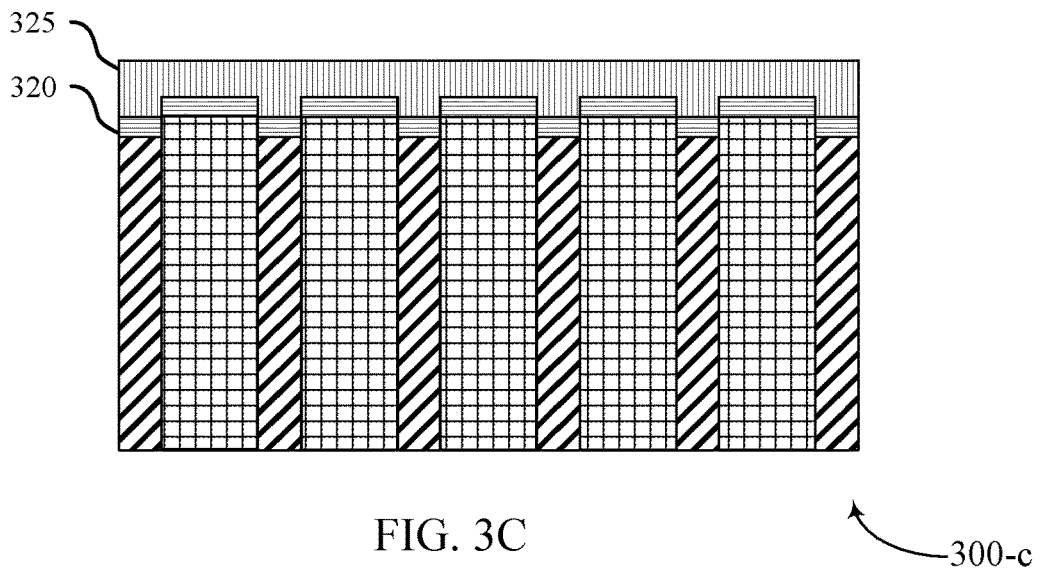

FIGS. 3A, 3B, and 3C illustrate cross-sectional views of layered assemblies of materials 300-*a*, 300-*b*, and 300-*c* that support low resistance crosspoint architecture in accordance with examples as disclosed herein.

In FIG. 3A, memory stacks 305 may be separated from each other by dielectric material 310. Memory stack 305 may be composed of electrode materials (e.g., electrodes 215 and 225 as described with reference to FIG. 2) and memory materials (e.g., memory cell 220 as described with reference to FIG. 2). Dielectric materials 310 may be configured to provide structure while limiting an amount of charge that may be transferred between memory stacks 305.

In some cases, the arrangement of materials on each memory stack 305 may be the same for each memory stack 305. For instance, if a first memory stack 305 has a bottom electrode material, a memory material above the bottom electrode material, and a top electrode material above the memory material, a second adjacent memory stack may have a corresponding bottom electrode material, a corresponding memory material, and a corresponding top electrode material. The set of materials that correspond to each other among memory stacks 305 may be considered a patterned layer. For instance, the set of bottom electrodes may be considered a first patterned layer; the set of memory materials may be considered a second patterned layer; and the set of top electrodes may be considered a third patterned layer. The individual materials of memory stack 305 are not illustrated in FIGS. 3A to 6B for the sake of clarity.

Additionally, a hard mask (HM) 315 may be used for patterning at least part of memory stacks 305, and after a first planarization step (e.g., via chemical mechanical planarization (CMP)) may be approximately at a level of the dielectric material 310 between memory stacks 305. In some cases, HMs 315 may be composed of a nitride material.

In FIG. 3B, a manufacturing system may perform another processing step to etch HMs 315 (e.g., a second CMP step) and at least a portion of dielectric materials 310 away, which may expose the tops of the memory stacks 305. The dielectric material 310 may have a higher rate of material removal than the HM 315 and memory stack 305, and may have a smaller height than the memory stacks 305 after the processing step to etch HMs 315. In some cases, the termination process to remove the HMs 315 may be a wet process that does not result in substantial socket dishing.

In FIG. 3C, a manufacturing system may deposit a thermal barrier material 320 onto the memory stacks 305 and the dielectric materials 310. The manufacturing system may deposit the thermal barrier material 320 such that the exposed tops and the exposed sides of the memory stacks 305 are fully covered. The manufacturing system may then deposit a conductive material 325 on top of the thermal barrier material 320. The manufacturing system may deposit the conductive material 325 such that the conductive material 325 has a relatively uniform surface on the top, or may perform processing (e.g., CMP) to produce the relatively uniform surface. In such cases, the thickness of the conductive material 325 may vary depending on whether the conductive material is over a memory stack 305 or a dielectric material 310.

Figure 4A:
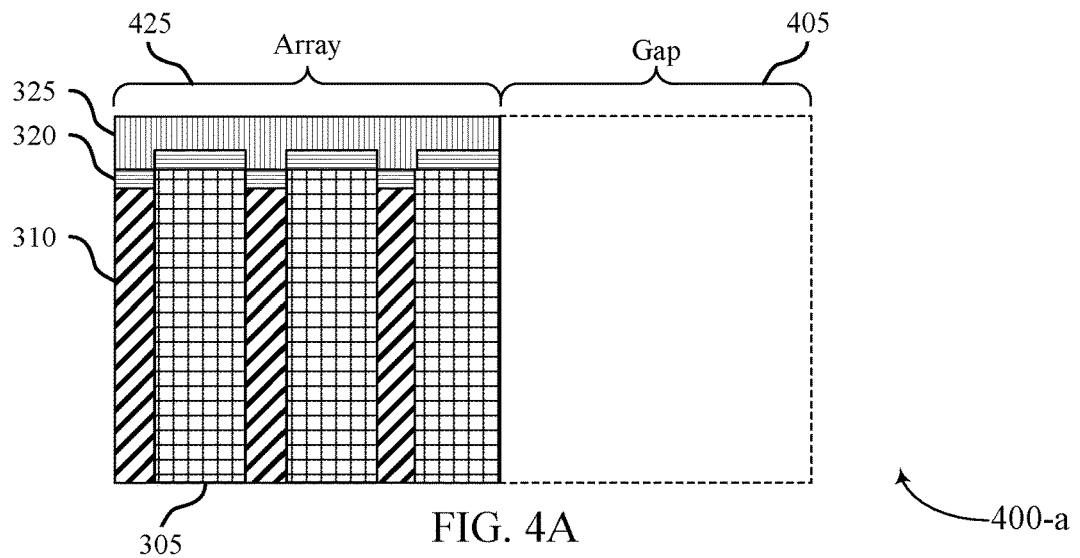
Figure 4B:
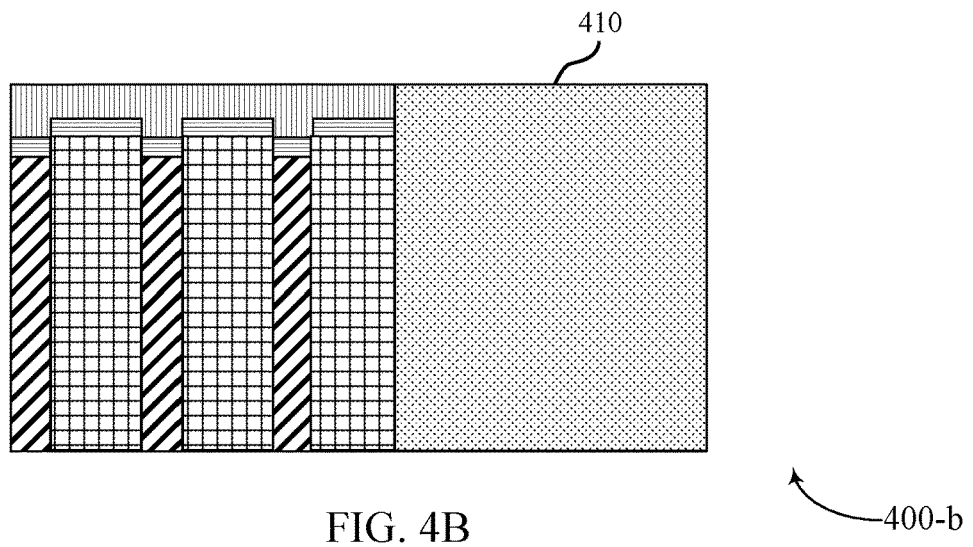
Figure 4C:
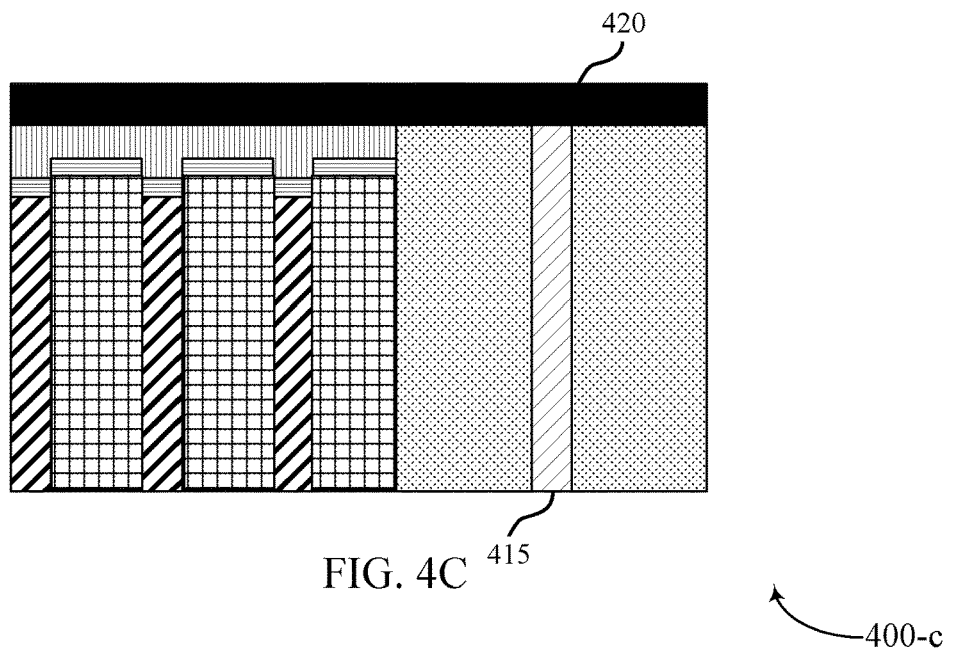

FIGS. 4A, 4B, and 4C illustrate cross-sectional views of layered assemblies of materials 400-a, 400-b, and 400-c that support low resistance crosspoint architecture in accordance with examples as disclosed herein. In some cases, FIGS. 4A, 4B, and 4C may represent steps undertaken after the steps represented by FIGS. 3A, 3B, and 3C have taken place.

In FIG. 4A, a manufacturing system may etch at least some of the memory stacks 305 and the dielectric material 310 away at a first area of the layered assembly to form a gap 405. In the same processing step, the manufacturing system may etch at least a portion of the thermal barrier material 320 and the conductive material 325. In some cases, the manufacturing system match etch one or multiple decks of memory stacks (e.g., the manufacturing system match etch one or more decks or all of the way to a substrate). FIG. 4A may illustrate the result of processing steps after FIG. 3C including deposition and patterning of a mask layer, and performing an etch with the patterned mask layer to remove the materials from the gap 405.

The presence of conductive material 325 may assist in preventing socket dishing at the interface between the array 425 and the gap 405. For example, where the conductive material 325 is not present when performing the etching, the etching may occur faster at the interface between the array 425 and the gap 405 due to increased CMP loading. Thus, the manufacturing process may cut into memory stacks 305 outside of the intended gap 405, which may be referred to as socket dishing. However, the planarization step to remove the mask over conductive material 325 may produce less socket dishing due to the different mask materials and increase in tolerance of the planarization (e.g., due to the thickness of the conductive material 325). The reduced socket dishing may reduce the possibility of damage impacting operation of the array or increase the number of layers that can be formed.

In FIG. 4B, the manufacturing system may deposit a dielectric material 410 in the gap 405. For example, from the assembly shown in FIG. 4A, deposition of the dielectric material 410 may be followed by a planarization step (e.g., CMP) to remove the dielectric material 410 over the array 425. The dielectric material 410 may be configured to provide structure and insulate the memory stack 305. After the planarization, the dielectric material 410 may have a top surface that is co-planar or substantially co-planar with the conductive material 325. In some cases, the conductive material 325 may serve to increase the tolerance of the planarization step where the thermal barrier material 320 is deposited prior to the termination etch to create the gap 405. For example, the conductive material 325 may be substantially thicker than the thermal barrier material 320. Without the conductive material 325 over the thermal barrier, stopping the planarization at or partially into the thermal barrier 320 may be challenging. For example, if the planarization step does not take off all of the dielectric material 410 over the array 425, the conductivity through the thermal barrier may be compromised. Meanwhile, if the planarization step takes off excess amounts of the thermal barrier material, the performance of the memory cells may be compromised. However, performing the planarization with the conductive material 325 may allow a greater tolerance for stopping the planarization within the thickness of the conductive material 325.

In FIG. 4C, the manufacturing system may etch the dielectric material 410 to form a gap or hole (e.g., using one or more mask steps). The gap may extend through the dielectric material 410 to, for example, a substrate below the dielectric material 410. The manufacturing system may deposit a conductive via material 415 in the gap such that the via material 415 extends through the dielectric material 410. The conductive via material 415 may have a surface in line with the dielectric material 410. In some cases, the conductive via material 415 may extend to a height within the layered assembly that is above the thermal barrier material 320.

Additionally, the manufacturing system may deposit a conductive material 420 on the conductive material 325, the dielectric material 410, and the conductive via material 415.

The conductive material 420 may couple the conductive via material 415 with the memory stacks 305 via the conductive material 325. The conductive materials 325 and 420 may be composed of a same material or may be composed of different materials. Together, conductive materials 325 and 420 may form an access line (e.g., a word line 110 or a bit line 115). In some cases, conductive material 420 may be composed of tungsten. In some cases, the manufacturing system may buff the conductive material 325 prior to deposition of the conductive material 420. Buffing may involve smoothing out the surface of the conductive material 325, and may assist in adherence of the conductive material 420 or conductivity between conductive material 325 and conductive material 420. In some cases, conductive material 325 may be composed of tungsten.

In some cases, where the steps of FIG. 3C do not occur (e.g., where the thermal barrier material 320 and the conductive material 325 are not deposited), the thermal barrier material 320 may be deposited after the conductive via material 415 is deposited but before the conductive material 420 is deposited. In such cases, the top surface of the dielectric material 410 and the conductive via material 415 may be in line with the memory stacks 305. However, by forming a memory device in this fashion, the thermal barrier material may create unnecessary resistance between the conductive via material 415 and the conductive material 420. Such extra resistance may limit the current which may delivered from the conductive via material 415. As such, by depositing the thermal barrier material 320 before the etching at FIG. 4A occurs, the manufacturing system may enable the conductive material 420 to interface with the conductive via material 415, directly.

Figure 5A:
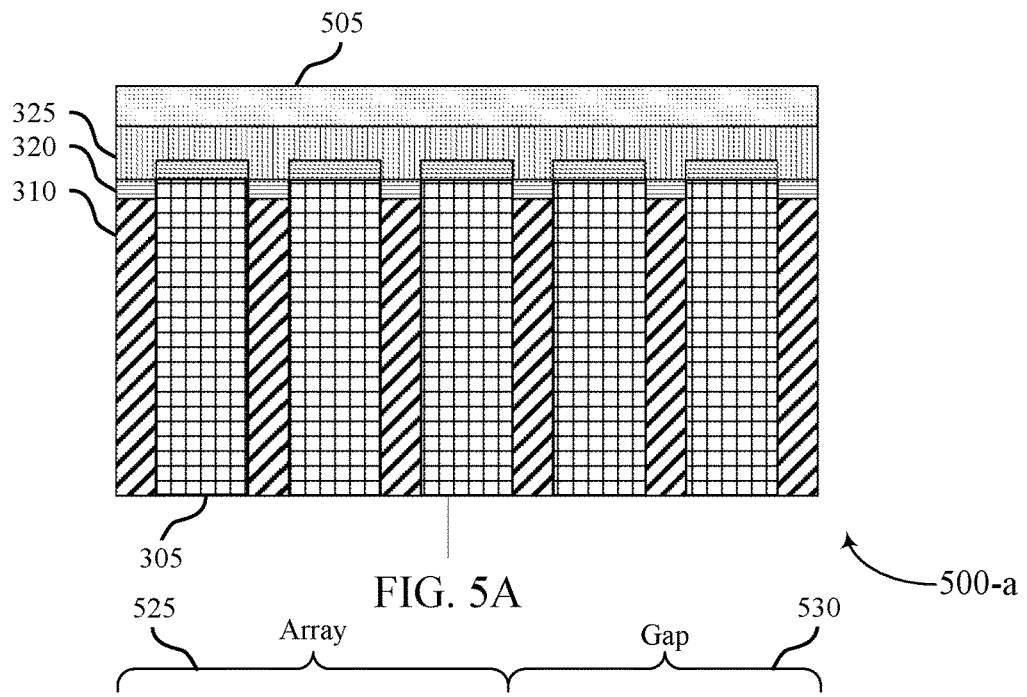
Figure 5B:
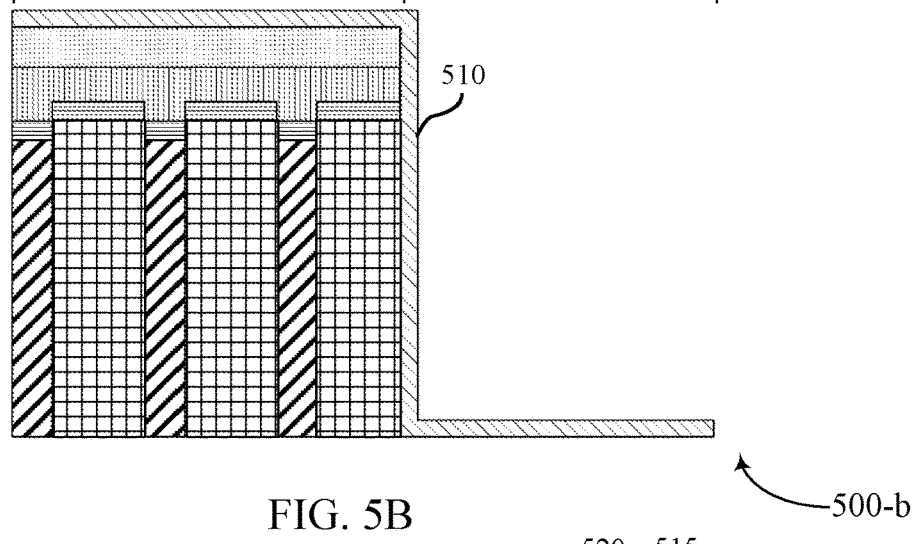
Figure 5C:
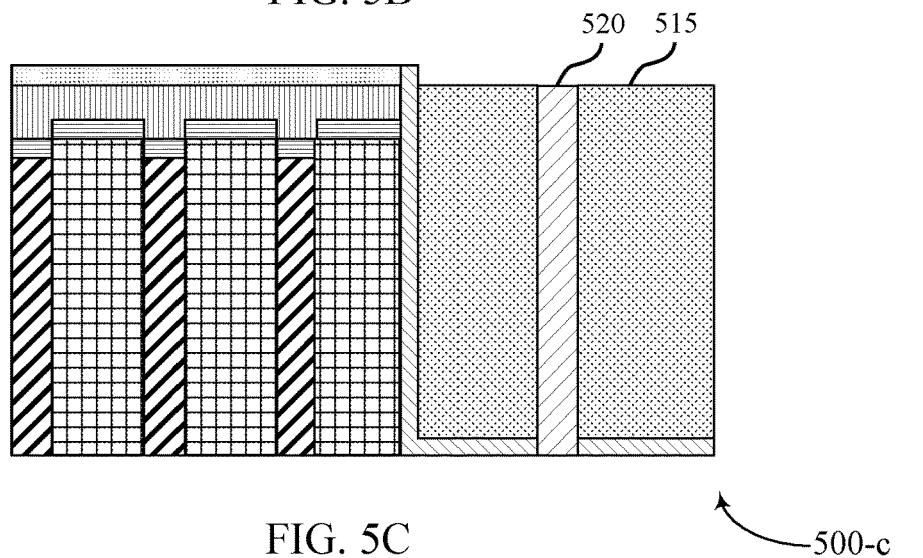

FIGS. 5A, 5B, and 5C illustrate cross-sectional views of layered assemblies of materials 500-a, 500-b, and 500-c that support low resistance crosspoint architecture in accordance with examples as disclosed herein. In some cases, FIGS. 5A, 5B, and 5C may represent steps undertaken after the steps represented by FIGS. 3A, 3B, and 3C have taken place In FIG. 5A, the manufacturing system may deposit a cap material 505 over the conductive material 325. The cap material 505 may protect the thermal barrier material 320, the conductive material 325, and the memory stacks 305 during processing. In some cases, the manufacturing system may buff the conductive material 325 prior to deposition of the cap material 505. Buffing may flatten the topography of the conductive material 325 and may enable the manufacturing system to deposit cap material 505 on a uniform surface.

In FIG. 5B, the manufacturing system may etch at least some of the memory stacks 305 and the dielectric material 310 away at a first area of the layered assembly to form a gap 530. In the same processing step, the manufacturing system may etch at least a portion of the thermal barrier material 320, the conductive material 325, and the cap material 505. Additionally, the manufacturing system may deposit a liner material 510 over the cap material 505 and in the gap 530. The liner material 510 may deposit over the exposed portions of the liner material 510, gap 530 (e.g., substrate), and sidewall of the array 525 (e.g., memory stack or dielectric). Thus, the liner material 510 may have a first horizontal portion over the cap material 505, a second horizontal portion over the gap 530, and a vertical portion that is in contact with an end of the cap material 505, an end of the conductive material 325, and an end of the thermal barrier material 320. The vertical portion of the liner material 510 may protect an adjacent memory stack 305, the cap material 505, the conductive material 325, the thermal barrier material 320 or a combination of these during additional processing or during operation (e.g., by additional insulative properties). The liner material 510 may, for example, have a higher dielectric constant than a dielectric material used to fill the gap 530.

Additionally, the vertical portion may be in contact with the memory stack 305. In some cases, the vertical portion may adjoin the first and second horizontal portions. The liner material 510 may be composed of the same material as the cap material 505 or may be composed of a different material. For instance, both the cap material 505 and the liner material 510 may be composed of a nitride-like material. Alternatively the cap material 505 may be composed of a nitride material and the liner material 510 may be composed of a nitride-like material different from the cap material 510.

The manufacturing system may use a two-step planarization or removal process to fill the gap 530 and planarize the assembly after deposition of a dielectric material 515. Initially, starting from FIG. 5A, the dielectric material 515 may be deposited over both the array 525 and gap 530 (not shown). A first planarization step may be used designed to stop on the cap material 505. The first planarization step may use a first slurry (e.g., an oxide slurry). The first planarization step may result in the assembly shown in FIG. 5C. Thus, the dielectric material 515 is shown over the second horizontal portion of the liner material 510 and filling the gap to approximately the height of the cap material 505 (or the portion of the cap material 505 that remains after the planarization step stops at the cap material 505).

After depositing the dielectric material 515 and performing the first planarization process, the manufacturing system may etch the dielectric material 515 and a portion of the liner material 510 to form a gap or hole. The manufacturing system may deposit a conductive via material 520 in the gap or hole such that the via material 520 extends through the dielectric material 515. In some cases, a top surface of the conductive via material 520 may be in line with dielectric material 515. In some cases, the conductive via material 520 may extend to a height within the layered assembly that is above the thermal barrier material.

Figure 6A:
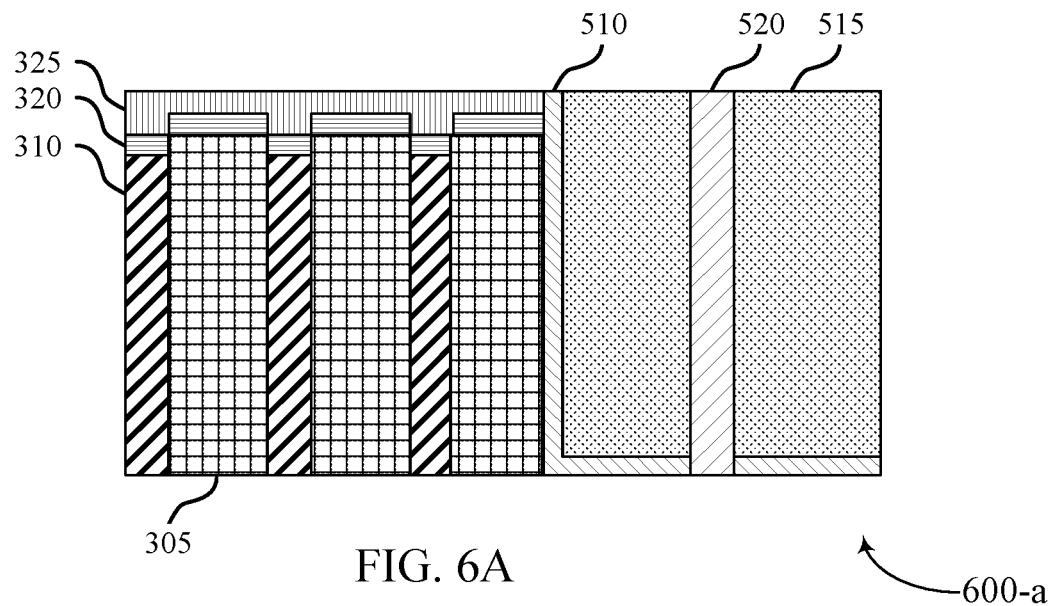

Subsequently, the manufacturing system may use a second planarization step to remove the cap material 505 to result in layered assembly of materials 600-a shown in FIG. 6A. The second planarization step may use different processing features than the first planarization step (e.g., a second, different slurry than the first slurry, a different pad). The second planarization process may be formulated to stop on the conductive material 325.

After the second planarization process is completed, a top surface of conductive material 325, a top surface of the vertical portion of the liner material 510, a top surface of dielectric material 515, and a top surface of conductive via material 520 may be approximately co-planar with each other.

Figure 6B:
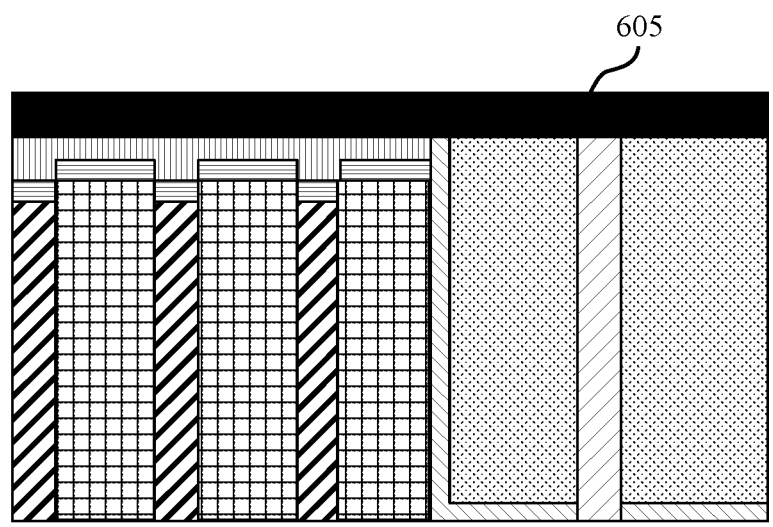

The manufacturing system may deposit a conductive material 605 on top of the conductive material 325, the vertical portion of the liner material 510, the dielectric material 515, and the conductive via material 520 to result in layered assembly of materials 600-b shown in FIG. 6B. The conductive material 605 may couple the conductive via material 520 with the memory stacks 305 via the conductive material 325. The conductive materials 325 and 605 may be composed of a same material or may be composed of different materials. If conductive materials 325 and 605 are composed of the same material, conductive material 325 may be considered to be a first layer and conductive material 605 may be considered to be a second layer. Together, conductive materials 325 and 605 may form an access line (e.g., a word line 110 or a bit line 115). In some cases, conductive material 605 may be composed of tungsten. In some cases, the manufacturing system may buff the conductive material 325 prior to deposition of the conductive material 605. Buffing may involve smoothing out the surface of the conductive material 325, and may assist in adherence of the conductive material 605 or conductivity between conductive material 325 and conductive material 605.

Similar to FIG. 4, depositing the thermal barrier material 320 before etching to form the gap for the dielectric material 515 may enable the conductive material 605 to interface directly with the conductive via material 520. If the thermal barrier material 320 had been deposited after etching to form the gap, the thermal barrier material 320 may be in between the conductive material 605 and the conductive via material 520, which may increase the resistance between the conductive material 605 and the conductive via material 520. As such, for a particular voltage, the amount of current may be increased for the former case as compared to the latter case.

Additionally, in some cases, the steps of FIGS. 3B and 3C may not occur. As such, the HMs 315 of FIG. 3A may not be removed and the thermal barrier material 320 and the conductive material 325 may not be deposited. In such cases, a cap material 505 may be deposited over dielectric materials 310 and HMs 315, such as in FIG. 5A; a liner material 510 may be deposited and a gap may be etched such as described in FIG. 5B; and a dielectric material 515 and a conductive via material 520 may be deposited as in FIG. 5C. After depositing the conductive via material 520, the horizontal portion of the liner material 510 over the cap material 505, the cap material 505, and the HMs 315 may be etched out (e.g., via CMP).

While the etching processes are occurring, the materials may be assembled such that the cap material 505 has thinner overburden and more CMP loading. As such, open areas (i.e., sockets) in the memory die may clear earlier, which may cause the sockets to be recessed, dished, or physically damaged before the HMs 315 over the array or tile are yet to clear completely. The methods described herein avoid this situation by etching out the HMs 315 prior to socket formation, which may prevent sockets from forming. If the termination process described in FIG. 3B is a wet process, the cap material 505 may be a nitride-like material, which may be a wet process selective film. Alternatively, to mitigate risks associated with changing the cap film, the cap material 505 may be composed of a nitride material. In either case, current delivery may be improved due to the lack of a thermal barrier to separate the conductive material 605 from the conductive via material 520. Additionally or alternatively, a process margin may be improved due to the conductive material 325 acting as stop layer for when cap material 505 is removed (e.g., at FIGS. 5C and 6A). As such, the methods disclosed herein may have a healthier process window as compared to the case described above where the steps of FIGS. 3B and 3C do not occur.

Generally, the processes as described herein may enable a smaller die size, as the processes described herein may limit tile damage that occurs at smaller scales. Additionally or alternatively, the processes described herein may decrease a size of sockets or may prevent the formation of sockets completely, which may lower a chance that tile damage will occur. Additionally or alternatively, the processes described herein may provide fewer dummy line opportunities.

Figure 7:
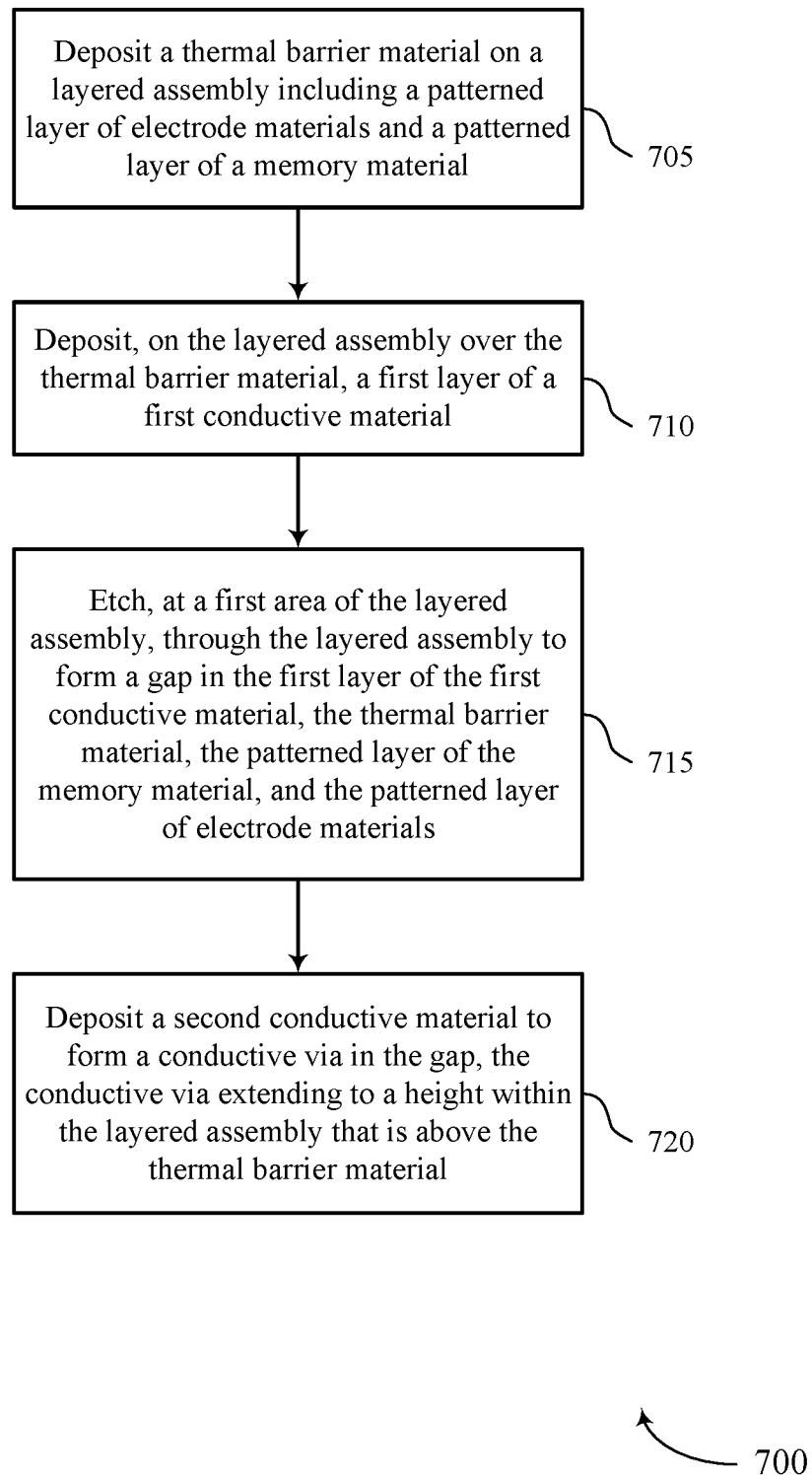
FIGS. 7 and 8 show flowcharts illustrating a method or methods that support low resistance crosspoint architecture in accordance with examples as disclosed herein.

FIG. 7 shows a flowchart illustrating a method or methods 700 that supports low resistance crosspoint architecture in accordance with examples as disclosed herein. The operations of method 700 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 705, the method 700 may include depositing a thermal barrier material on a layered assembly including a patterned layer of electrode materials and a patterned layer of a memory material. The operations of 705 may be performed according to the methods described herein.

At 710, the method 700 may include depositing, on the layered assembly over the thermal barrier material, a first layer of a first conductive material. The operations of 710 may be performed according to the methods described herein.

At 715, the method 700 may include etching, at a first area of the layered assembly, through the layered assembly to form a gap in the first layer of the first conductive material, the thermal barrier material, the patterned layer of the memory material, and the patterned layer of electrode materials. The operations of 715 may be performed according to the methods described herein.

At 720, the method 700 may include depositing a second conductive material to form a conductive via in the gap, the conductive via extending to a height within the layered assembly that is above the thermal barrier material. The operations of 720 may be performed according to the methods described herein.

In some examples, an apparatus as described herein may perform a method or methods, such as the method 700. The apparatus may include features, means, or instructions (e.g., a non-transitory computer-readable medium storing instructions executable by a processor) for depositing a thermal barrier material on a layered assembly including a patterned layer of electrode materials and a patterned layer of a memory material, depositing, on the layered assembly over the thermal barrier material, a first layer of a first conductive material, etching, at a first area of the layered assembly, through the layered assembly to form a gap in the first layer of the first conductive material, the thermal barrier material, the patterned layer of the memory material, and the patterned layer of electrode materials, and depositing a second conductive material to form a conductive via in the gap, the conductive via extending to a height within the layered assembly that is above the thermal barrier material.

Some examples of the method 700 and the apparatus described herein may further include operations, features, means, or instructions for depositing a second layer of the first conductive material over the first layer of the first conductive material and the conductive via, where the second layer couples the first layer of the first conductive material with the conductive via.

Some examples of the method 700 and the apparatus described herein may further include operations, features, means, or instructions for buffing the first conductive material prior to depositing the second layer of the first conductive material.

Some examples of the method 700 and the apparatus described herein may further include operations, features, means, or instructions for depositing a dielectric material in the gap, where the conductive via extends through the dielectric material in the gap.

Some examples of the method 700 and the apparatus described herein may further include operations, features, means, or instructions for depositing a liner material over the layered assembly prior to depositing the dielectric material.

Some examples of the method 700 and the apparatus described herein may further include operations, features, means, or instructions for performing a first planarization process with a first slurry, the first planarization process removing a first portion of the liner material.

Some examples of the method 700 and the apparatus described herein may further include operations, features, means, or instructions for performing a second planarization process with a second slurry, the second planarization process removing a second portion of the liner material.

Some examples of the method 700 and the apparatus described herein may further include operations, features, means, or instructions for depositing a cap material over the layered assembly prior to etching through the layered assembly at the first area.

Figure 8:
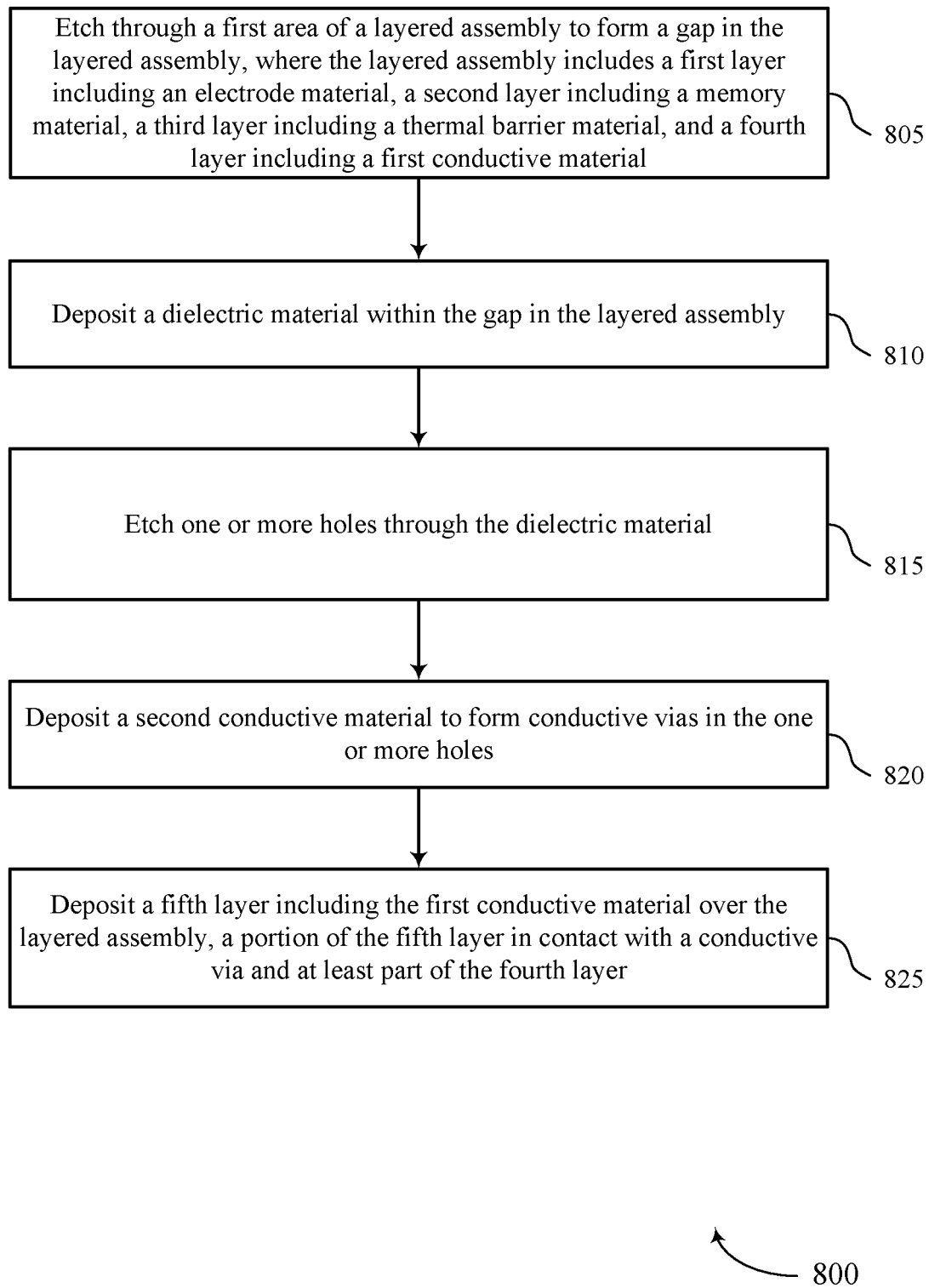

FIG. 8 shows a flowchart illustrating a method or methods 800 that supports low resistance crosspoint architecture in accordance with examples as disclosed herein. The operations of method 800 may be implemented by a manufacturing system or one or more controls associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 805, the method 800 may include etching through a first area of a layered assembly to form a gap in the layered assembly, where the layered assembly includes a first layer including an electrode material, a second layer including a memory material, a third layer including a thermal barrier material, and a fourth layer including a first conductive material. The operations of 805 may be performed according to the methods described herein.

At 810, the method 800 may include depositing a dielectric material within the gap in the layered assembly. The operations of 810 may be performed according to the methods described herein.

At 815, the method 800 may include etching one or more holes through the dielectric material. The operations of 815 may be performed according to the methods described herein.

At 820, the method 800 may include depositing a second conductive material to form conductive vias in the one or more holes. The operations of 820 may be performed according to the methods described herein.

At 825, the method 800 may include depositing a fifth layer including the first conductive material over the layered assembly, a portion of the fifth layer in contact with a conductive via and at least part of the fourth layer. The operations of 825 may be performed according to the methods described herein.

A memory device prepared by a process is described. The process may include the steps of etching through a first area of a layered assembly to form a gap in the layered assembly, where the layered assembly includes a first layer including an electrode material, a second layer comprising a memory material, a third layer comprising a thermal barrier material, and a fourth layer comprising a first conductive material; depositing a dielectric material within the gap in the layered assembly; etching one or more holes through the dielectric material; depositing a second conductive material to form conductive vias in the one or more holes; and depositing a fifth layer comprising the first conductive material over the layered assembly, a portion of the fifth layer in contact with a conductive via and at least part of the fourth layer.

In some examples, the process may further include the steps of depositing a cap material over the layered assembly prior to etching through the first area. In some examples, the process may further include the steps of depositing a liner material over the layered assembly prior to depositing the dielectric material. In some examples, the cap material and the liner material may be the same material. In some examples, the cap material and the liner material may be different materials. In some examples, the process may further include the steps of buffing the first conductive material prior to depositing the fifth layer.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a first portion of a memory device including a first patterned layer including an electrode material; a second patterned layer including a memory material; and a third patterned layer including a conductive material and a thermal barrier material. The apparatus may include a second portion of the memory device including a fourth patterned layer including a set of vias through a dielectric material, the fourth patterned layer extending to a height that exceeds a height of the thermal barrier material in the third patterned layer and a fifth patterned layer including the conductive material, wherein a thickness of the conductive material in the fifth patterned layer is less than a thickness of the conductive material in the third patterned layer.

In some examples, the memory device may include a liner material in contact with the first patterned layer, the second patterned layer, and the third patterned layer, where the liner material forms a separating barrier between the first portion of the memory device and the second portion of the memory device. In some examples, the liner material includes a first portion extending in a first direction and a second portion extending in a second direction, where the first portion is in contact with the first patterned layer, the second patterned layer, and the third patterned layer, and where the second portion is punctured by the set of vias.

In some examples, a patterned member of the conductive material is in direct contact with a via of the fourth patterned layer. In some examples, the thermal barrier material includes tungsten silicon nitride. In some examples, the conductive material includes tungsten.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory device, comprising:
   a first portion, comprising:
      a first patterned layer comprising an electrode material;
      a second patterned layer comprising a memory material; and
      a third patterned layer comprising a thermal barrier material;
   a second portion comprising:
      a fourth patterned layer comprising a plurality of vias through a dielectric material, the fourth patterned layer extending to a height that exceeds a height of the thermal barrier material in the third patterned layer; and
   a conductive material over the first portion and the second portion, wherein a thickness of the conductive material over the first portion is larger than a thickness of the conductive material over the second portion, and wherein the conductive material is in contact with the dielectric material of the fourth patterned layer.

2. The memory device of claim 1, further comprising:
   a liner material in contact with the first patterned layer, the second patterned layer, and the third patterned layer, wherein the liner material forms a separating barrier between the first portion of the memory device and the second portion of the memory device.

3. The memory device of claim 2, wherein the liner material comprises a first portion extending in a first direction and a second portion extending in a second direction, wherein the first portion is in contact with the first patterned layer, the second patterned layer, and the third patterned layer, and wherein the second portion is punctured by the plurality of vias.

4. The memory device of claim 1, wherein a patterned member of the conductive material is in direct contact with a via of the fourth patterned layer.

5. The memory device of claim 1, wherein the thermal barrier material comprises tungsten silicon nitride.

6. The memory device of claim 1, wherein the conductive material comprises tungsten.

* * * * *